United States Patent [19]

Candelaria et al.

[11] 4,446,194
[45] May 1, 1984

[54] DUAL LAYER PASSIVATION

[75] Inventors: Jon Candelaria, Mesa, Ariz.; Kurt S. Heidinger, Santa Clara, Calif.

[73] Assignee: Motorola, Inc., Schaumburg, Ill.

[21] Appl. No.: 391,047

[22] Filed: Jun. 21, 1982

[51] Int. Cl.³ ............................................. B05D 3/14
[52] U.S. Cl. .................................. 428/428; 357/54; 427/39; 427/93; 428/432
[58] Field of Search ............... 427/38, 39, 93, 94, 427/96; 357/52, 53, 54; 428/428, 432

[56] References Cited

U.S. PATENT DOCUMENTS

| | | | |
|---|---|---|---|
| 3,560,810 | 2/1971 | Balk et al. | 427/93 |
| 4,076,575 | 2/1978 | Chang | 427/96 |
| 4,086,614 | 4/1978 | Scheidel | 427/93 |
| 4,091,406 | 5/1978 | Lewis | 427/94 |
| 4,091,407 | 5/1978 | Williams et al. | 427/94 |

*Primary Examiner*—John H. Newsome
*Attorney, Agent, or Firm*—Robert M. Handy

[57] ABSTRACT

When multilayer-metal electronic devices are heated, voids can form in the metal layers. Void formation is avoided by using a double dielectric layer as the interlayer dielectric. The double layer has a first oxide layer portion in contact with the first metal which is formed by plasma assisted chemical vapor deposition, and a second oxide layer portion formed by other means. The plasma formed oxide layer portion is believed to be in compressive stress relative to the substrate.

12 Claims, 4 Drawing Figures

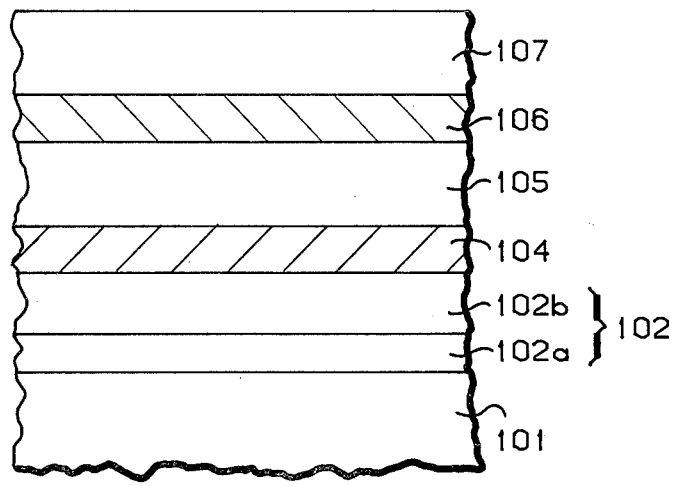
FIG 1B
- PRIOR ART -
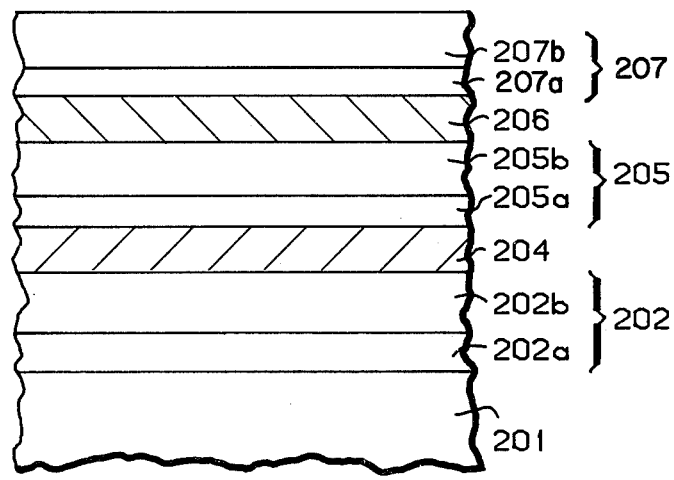
FIG 2B
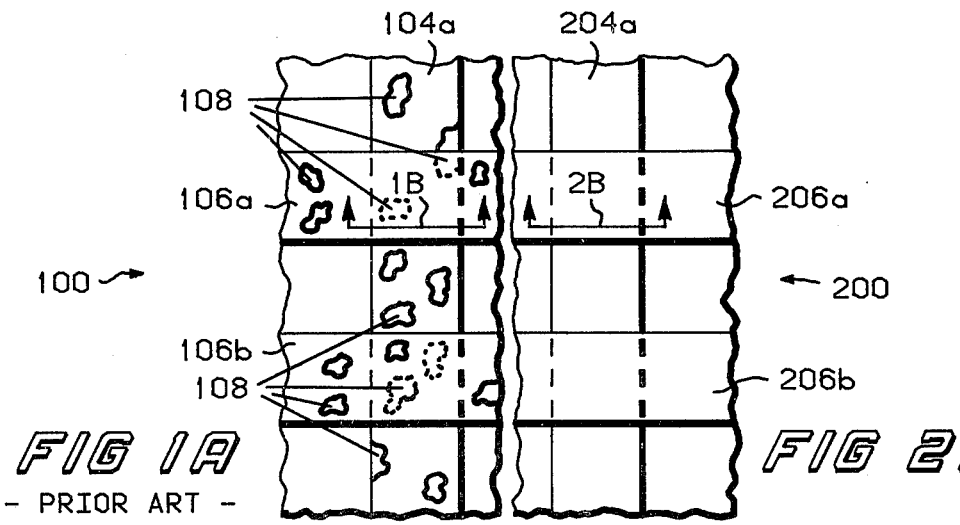
FIG 1A
- PRIOR ART -
FIG 2A

DUAL LAYER PASSIVATION

BACKGROUND OF THE INVENTION

1. Field of the Invention

This invention relates, in general, to means and methods for improved electronic devices, especially semiconductor devices and integrated circuits, and more particularly, to an improved manufacturing process for structures involving passivated metal layers or multiple passivated metal layers on nitride passivated substrates, and to structures, devices, and circuits made thereby.

2. Background Art

It is common practice in the manufacture of semiconductor devices and integrated circuits, and other electronic devices as well, to protect the semiconductor surface and the metal surface layers with a covering dielectric. This dielectric is referred to as the passivation layer or the metal passivation layer, and is often the outermost layer of the device. Openings are provided in the passivation layer through which external connections to the device may be made. As used herein, the word "device" is intended to include both individual devices, portions of devices, and collections of devices, as for example in integrated circuits and the like.

Frequently, a device will require multiple metal layers, one crossing over the other and separated by an interlayer dielectric. In this case the interlayer dielectric serves to passivate the first metal layer as well as insulate and separate it from the overlying second metal layer. Interlayer connection points are provided through openings formed for that purpose in the passivation layer serving as the interlayer dielectric.

With semiconductor and other devices having conductive substrates, a primary dielectric layer is also required between the substrate and any metal layers. This dielectric serves to passivate the substrate surface as well as insulate it from the metal layer or layers. Again, openings may be provided for connection points. When structures involving one or more metal layers superimposed on a dielectric layer and covered by a passivation layer are heated during subsequent manufacturing stages, as for example during assembly die bonding, it is found that voids frequently form in the metal layer or layers. These voids can be of appreciable size relative to the thickness and width of the metal conductor paths. The voids create weaknesses in the conductor paths which lead to reduced manufacturing yield and poorer reliability. This phenomenon is particularly severe when an aluminum alloy is used for the metal layer or layers and one of the several dielectric layers includes a nitride material. Thus, a need exists for a system of materials and manufacturing methods which reduces or eliminate the formation of voids in layered structures wherein one or more metal layers are sandwiched between dielectric layers. Because of their widespread use, there is a particular need for reducing or eliminating void formation in silicon oxide—nitride—aluminum alloy—doped oxide layer structures.

Accordingly, it is an object of this invention to provide an improved manufacturing method for the formation of metal—passivation layer structures wherein void formation in the metal layer is reduced or eliminated.

It is a further object of this invention to provide an improved manufacturing method for the formation of dielectric—first metal—first passivation—second metal—second passivation layer structures wherein void formation in one or both metal layers is reduced or eliminated.

It is an additional object of this invention to provide an improved process for the manufacture of dielectric—metal—passivation layer structures and/or dielectric—first metal—first passivation layer—second metal—second passivation layer structure, wherein the passivation layer or layers comprise a double layer.

It is a further object of this invention to provide the double layer by means of a first layer portion of a plasma formed oxide in contact with the underlying metal, and a second layer portion of a doped oxide overlying the first layer portion.

It is an additional object of this invention to provide the first layer portion by means of plasma enhanced chemical vapor deposition.

It is an additional object of this invention to provide the double layer by means of a first layer portion of an oxide which is in compressive stress and a second layer portion of an oxide which is not in compressive stress.

It is a further object of this invention to provide improved electronic devices made by the methods of this invention.

SUMMARY OF THE INVENTION

In a first embodiment of the invention, a substrate is first coated with a primary passivation (dielectric) layer. It is desirable that this primary passivation layer have an outer surface comprising a nitride. A metal layer is next formed on the outer surface and then overcoated with a metal passivation layer comprising a first portion of a plasma formed oxide, and a second portion of a doped oxide formed by other means. Optional contacts between the substrate and the metal layer are provided by openings cut for that purpose in the primary passivation layer. The plasma formed oxide is conveniently created by plasma enhanced chemical vapor deposition.

In a second embodiment of the invention, a substrate is first coated with a primary passivation layer. A metal layer is next formed on the outer surface and then overcoated with a first metal passivation layer comprising a first portion of an oxide which is in compressive stress and a second portion of an oxide which is not in compressive stress. Optional contacts between the substrate and the metal layer are provided by openings cut for that purpose in the primary passivation layer.

In a third embodiment, a multilayer metal structure is obtained by taking the structure formed in the first or second embodiment and thereafter coating the first metal passivation layer with a second metal layer. It is desirable that the second metal be further coated with a second metal passivation layer of the same composition as the first metal passivation layer to inhibit void formation in the second metal layer. Optional contacts between metal layers are provided by openings cut for that purpose in the first metal layer passivation.

Devices made using the process are substantially more resistant to void formation in the metal layer or layers during heating of the devices, and have lower manufacturing cost and improved reliability.

BRIEF DESCRIPTION OF THE DRAWINGS

FIG. 1A is a top view of a portion of a prior art device having two layers of metal conductors, one crossing over the other, and showing voids formed in the metal layers.

FIG. 1B is a cross sectional view in simplified form of a crossover portion of the prior art device of FIG. 1A showing a typical arrangement of layers.

FIG. 2A is a top view of a portion of a device according to the present invention, having two layers of metal conductors, one crossing over the other and without voids.

FIG. 2B is a cross sectional view in simplified form of a crossover portion of the device of FIG. 2A showing the arrangement of layers.

DETAILED DESCRIPTION OF THE DRAWINGS

In the description which follows, the structure and materials are illustrated for the case of a silicon semiconductor substrate on which are formed various silicon oxide and nitride layers. It will be readily apparent to those of skill in the art that other substrate materials could be employed. As will be subsequently discussed, various other oxide and nitrides, as well as other dielectric materials, are believed to be useful.

FIGS. 1A-B show a portion of prior art device 100 comprising substrate 101, covered by primary passivation layer 102 made up, for example, of buffer oxide layer 102a and nitride layer 102b. First metal layer 104 is formed on nitride layer 102b and overcoated by first passivation layer 105. In single metal layer devices, first passivation layer 105 forms the outermost layer of the device and layers 106-107 are not present. In multilayer metal devices, first passivation layer 105 serves as the interlayer dielectric and is overcoated by second metal layer 106 and second passivation layer 107. Methods for forming layers 102-107 are well known in the art. For example, passivation layers 105 and 107 are conveniently formed by chemical vapor deposition (CVD) of silicon oxide at temperatures in the range 350°-550° C., 450° C. being typical.

FIG. 1A illustrates the situation in which first metal layer 104 has been formed into vertical conductor 104a, and second metal layer 106 has been formed into two horizontal conductors 106a-b. Interconnections (not shown) between conductors 104a and 106a-b are optionally provided by means of openings ("vias") in first passivation layer 105 at the appropriate crossing points. Optional interconnections (not shown) between substrate 101 and conductors 104a and/or 106a-b are provided by means of other vias in layer 102 and 105 at desired locations. Methods for delineating conductor paths and forming vias are well known in the art.

FIG. 1A further illustrates the formation of voids 108 in conductors 104a and/or 106a-b as a result of heating the device (e.g. to temperatures above 450° C.) subsequent to the formation of metal layer 104 and passivation layer 105, or alternatively, after the formation of metal layers 104 and 106 and passivation layers 105 and 107. Voids 108, shown pictorially in FIG. 1A, typically penetrate through the thickness of conductors 104a and/or 106a-b. They often occupy a substantial portion of the lateral cross-section of conductor 104a, conductors 106a-b, or both. Voids 108 can completely rupture conductors 104a and/or 106a-b causing the finished device to be inoperative. Even if the voids do not initially break conductors 104a and/or 106a-b, when the device is energized, the current density in conductor 104a and/or 106a-b is increased above the design value. This accelerates electro-migration effects which cause further enlargement of voids 108, or growth of new voids, until conductors 104a and/or 106a-b are finally interrupted. Thus, not only will the initial manufacturing yield be lower, but those devices which may initially function will have reduced reliability and shorter useful lives.

FIG. 2A is a top view of device portion 200 according to the present invention, and FIG. 2B is a schematic cross sectional view of a crossover portion of the same device, showing the arrangement of layers. In FIG. 2A, first metal layer 204 has been formed into vertical conductor 204a, and second metal layer 206 has been formed into horizontal conductors 206a-b. As with the prior art device portion of FIGS. 1A-B, optional interconnections (not shown) between the metal layers and between the metal layers and the substrate can be provided by vias placed in passivation layers 205 and/or 202 at the appropriate locations. The lateral geometry of the conductor pathways in FIG. 2A is the same as in FIG. 1A, but there are no voids.

In FIG. 2B, substrate 201 is covered by primary passivation layer 202 comprising, typically, buffer oxide layer 202a and nitride layer 202b. Buffer oxide layer 202a is desirable when substrate 201 is a semiconductor such as silicon, but it is not necessary. Substrate 201 may be any suitable material, such as, ceramic, glass, semiconductor, metal, plastic, or a combination thereof, and may be single crystal, polycrystalline, amorphous or a combination thereof. It is desirable that the surface which receives the metal layers be reasonably smooth compared to the thickness of the metal layers.

First metal layer 204 is formed on nitride layer 202b and overcoated with first passivation layer 205. In single metal layer devices, first passivation layer 205 forms the outermost layer of the device and layers 206-207 are not present. In multilayer metal devices, first passivation layer 205 serves as the interlayer dielectric and is overcoated by second metal layer 206 and second passivation layer 207. Layer 207 passivates and protects layer 206 as well as the underlying layers exposed where portions of metal layer 206 have been removed in creating conductor paths 206a-b. Layer 207 is desirable but not mandatory.

It has been discovered that void formation associated with the prior art device structure of FIGS. 1A-B can be avoided by forming passivation layer 205 and desirably also layer 207 as double layers. The exact mechanism by which the use of a double layer inhibits void formation is not known. There is believed to be a large residual tensile stress present in metal layer 104. The stress comes about as a result of the differential thermal contraction or expansion of the metal and dielectric layers which are formed at different temperatures. As additional layers are added on top of metal 104 (e.g. layer 105 and, optionally, layers 106 and 107), the stress may be frozen in. It is believed that the doped or undoped oxides prepared by sputtering or chemical vapor deposition which are normally used as interlayer passivation dielectric 105 do not contribute to relieving this stress, so that when the devices are subsequently heated the residual stress accelerates void formation in the metal layer or layers.

Frequently, interlayer dielectric passivation 105 is prepared by chemical vapor deposition (CVD) of a substantially pure silicon oxide, or a silicon oxide doped with phosphorous, boron or other elements which assist in stabilizing the materials. Void formation is observed when aluminum or aluminum alloy metal layers are used in conjunction with these materials. It has been discovered that void formation in metal layer 104 is inhibited by replacing passivation layer 105 with double layer 205, in which first portion 205a is formed by plasma assisted chemical vapor deposition (PACVD) and second portion 205b is formed by other means, such as ordinary CVD. Similarly, void formation in layer 106 is inhibited by replacing passivation layer 107 with double layer 207 in a like manner.

The physical properties of the PACVD passivation material used for layer portion 205a are believed to be different than the physical properties of the CVD passivation material used for layer 105 or layer portion 205b. In "Plasma Deposition of Silicon Dioxide and Silicon Nitride", Solid State Technology, page 167, April 1981, by E. van de Ven, it is reported that PACVD $SiO_2$ shows intrinsic compressive stress on silicon, while conventional CVD $SiO_2$ shows intrinsic tensile stress. It is also known that addition of dopants such as phosphorus can reduce the intrinsic tensile stress of ordinary CVD oxides so as to produce doped oxide layers having little or no tensile stress relative to silicon substrate. It is not clear how these and other characteristics of the different passivation oxides interact with the metal layer to reduce void formation, but the different intrinsic stress characteristics are believed to be important, that is, void formation is reduced when layer portion 205a is formed from a material having intrinsic compressive stress relative to the substrate when combined with layer portion 205b which does not have intrinsic compressive stress relative to the substrate.

It is not practicable to use the PACVD oxide alone, that is, to make layer 205 entirely of PACVD oxide. This is because there are local variations in the etch rate which result in a loss of definition in the interconnect vias. Additionally, the etch rate and apparent porosity of the PACVD oxide is different depending on whether it rests on metal or nitride. The apparent porosity is greater over the nitride. Thus a via which extends beyond the edge of a metal stripe onto the nitride surface has very ragged edges over the nitride. Poor via definition reduces manufacturing yield. This problem is avoided by the double layer structure since definition of the vias is controlled by the relatively thicker outer CVD material, while the buffering or stress relief function to inhibit void formation in the underlying metal is provided by the comparatively thinner PACVD material placed in contact with the underlying metal layer.

The following example of a preferred structure and method of manufacture is illustrated for a silicon based semiconductor device having two metal layers. It will be readily apparent to one of skill in the art that the method and structure so described apply to a wide choice of substrate materials and device configurations, particularly those which utilize a nitride passivation layer or other dielectric materials underlying the metal layer which can produce a high stress condition in the metal.

Silicon wafer substrate 201 is preferably but not essentially, coated with thin buffer layer 202a of silicon oxide of a thickness in the range of 10-200 nm, with 100 nm being convenient, and then coated with nitride layer 202b, preferably of silicon nitride, of a thickness in the range 10-1000 nm, with 90-110 nm being convenient. First metal layer 204 of aluminum, or (96% Al):(4% Si) or (94% Al):(1.5% Si):(1.5% Cu) alloy is formed on layer 202b. First metal layer 204 has a thickness in the range 20-2000 nm with 600-800 nm being convenient. Methods for forming metal layers of these and other materials are well known in the art. Sputtering was found to be convenient. Buffer oxide 202a is typically thermally grown and nitride layer 202b is typically deposited by vacuum CVD techniques. Such techniques are well known in the art. Other methods such as sputtering and PACVD are also useful.

Passivation layer 205 is formed as a double layer by depositing, in contact with metal layer 204, first layer portion 205a of a substantially pure PACVD silicon oxide of thickness in the range 10-500 nm, with 90-110 nm being convenient. Second layer portion 205b is then deposited over first layer portion 205a. Second layer portion 205b comprises, typically, a 5% to 6.5% phosphorous doped CVD silicon oxide of thickness in the range 500-2000 nm, with 5.75% phosphorous and 810-990 nm thickness being preferred. While the thickness of layer portions 205a and 205b can be varied over a wide range, it is desirable that portion 205b be thicker than portion 205a in order to facilitate preparation of vias by chemical etching.

PACVD of silicon oxide for layer 205a has been carried out in a commercial reactor, model 3000 PLASMA-II reactor manufactured by Applied Materials Corporation, 3050 Bowers Avenue, Santa Clara, Calif., using silane and nitrous oxide as source gases. Other silicon bearing gases and oxidant gases will also serve, and a wide range of source to oxidant ratios can be used so long as there is an excess of oxidant. Pressures in the range 100-500 microns (13.3-66.5 Pa), temperatures in the range 250°-500° C., silane flow rates in the range 6-600 ml per minute, silane to oxidant ratios in the range 1:2-1:100, and reactor power levels above 10 watts are useful. The deposition rate increases as power level and reactant flow rate are increased. A deposition rate of approximately 40 nm thickness per minute was obtained when the reactor was operated at a pressure of 250 microns (33.3 Pa), a power level of 150 watts, a silane flow rate of 60 ml per minute, a temperature of 300° C. and a silane to oxidant ratio of 1:15. These settings were found to be convenient. The index of refraction of PACVD silicon oxide layers was in the range 1.57-1.61, as compared to 1.45 for the phosphorous doped or substantially pure CVD silicon oxide layers. PACVD silicon oxide layers as used herein were found to be in compressive stress relative to [100] silicon substrates. Phosphorous doped CVD oxide layers as used herein, were found not to be in compressive stress relative to [100] silicon substrates.

The phosphorous doped CVD silicon oxide was prepared by methods well known in the art using a standard hot walled CVD reactor operating at temperatures in the range 350 to 550 degrees C., with 400 to 500 degrees C. being preferred and 450° C. being convenient. Conventional photoresist and etching steps were used, when desired, to open vias in layer 205 to permit contact to metal layer 204 and in layer 202 to permit connections between layer 204 and substrate 201. In a single metal layer device, layer 205 serves as the final passivation layer and is typically the outermost layer of the device.

For a multilayer metal device, second metal layer 206 is formed on first passivation layer 205 which then serves as the interlayer dielectric. Metal layer 205 may be of any suitable material. The same materials and range of thicknesses as in first metal layer 204 are conveniently used for second metal layer 206. Second metal passivation layer 207 is formed on second metal layer 206. Layer 207 may be of the same or different dielectric materials as in layer 205. It is convenient to use the same materials and range of thicknesses, and to form layer 207 with the same double layer structure as in layer 205 in order to inhibit void formation in second metal layer 206. In a two layer metal device, passivation layer 207 is often the outermost layer of the device. Openings (vias) are cut in layer 207 by means well known in the art to permit external connections to metal layer 206 and/or to permit interconnections between layers 206 and 204. Sometimes, an organic coating is applied over layer 207 for further protection from the ambient.

Devices prepared according to the methods described above and without an organic overcoat were subjected to extended heating at temperatures exceeding 500° C. Prior art devices having similar layer thicknesses and prepared by substantially similar techniques, but using ordinary CVD oxides for passivation layers and lacking the double layer passivation structure of the present invention, were used as controls and similarly tested. The prior art devices showed significant void formation in the first and/or second metal layers while the devices prepared according to the present invention had no voids. The manufacturing yield and reliability of the devices prepared according to the present invention were thereby improved.

The invention has been illustrated for the situation wherein double layer portions 205a, 205b (and optionally 207a, 207b) were prepared by, respectively, PACVD of substantially pure silicon oxide, and CVD of phosphorous doped silicon oxide. It is believed that other preparation methods and materials will also serve, provided that the resulting films have properties similar to those obtained by these methods, in particular, that layer 205a exhibit intrinsic compressive stress and layer 205b not exhibit intrinsic compressive stress relative to substrate 201. As used herein, the words "plasma derived" or "plasma assisted" refer to formation methods for dielectric passivation layers which use gas plasma and/or gas discharge reactions to form dielectric films, such as, but not limited to, plasma assisted chemical vapor deposition (PACVD).

The invention has further been illustrated for the situation where an aluminum alloy was used as the metallization. It will be readily apparent to those of skill in the art, that other metals can also be used. Accordingly it is intended to include these and other variations that are within the scope and spirit of the present invention.

We claim:

1. In a process for fabricating electronic devices wherein a first metal layer is formed on a first dielectric layer on a substrate, an interlayer dielectric is formed on said first metal layer, and a second metal layer is formed on said interlayer dielectric, the improvement comprising, forming said interlayer dielectric by depositing on said first metal layer a plasma derived oxide and overlying said plasma derived oxide with an other oxide formed by other means.

2. The process of claim 1 wherein said depositing step comprises depositing said plasma derived oxide by plasma enhanced chemical vapor deposition and wherein said other oxide is formed by chemical vapor deposition.

3. The process of claim 2 wherein said first dielectric layer comprises silicon nitride, said plasma derived oxide comprises silicon oxide, and said other oxide comprises a phosphorous doped silicon oxide.

4. In a process for fabricating electronic devices wherein a first metal layer is formed on a first dielectric layer on a substrate, an interlayer dielectric is formed on said first metal layer, and a second metal layer is formed on said interlayer dielectric, the improvement comprising, forming said interlayer dielectric by depositing on said first metal layer a first oxide exhibiting intrinsic compressive stress relative to said substrate, and covering said first layer by a second layer not exhibiting substantial intrinsic compressive stress relative to said substrate and formed by a different process than said first oxide layer.

5. The process of claim 4 wherein said depositing step comprises depositing said first oxide by plasma enhanced chemical vapor deposition.

6. The process of claim 5 wherein said first dielectric layer comprises silicon nitride, said first oxide comprises silicon oxide, and said second oxide comprises a phosphorous doped silicon oxide.

7. A process for fabricating electronic devices on a substrate comprising:
   forming on said substrate a first dielectric layer;
   forming on said first dielectric layer a first metal layer;
   forming on said first metal layer a second dielectric layer having a predetermined compressive stress;
   forming on said second dielectric layer a third dielectric layer substantially free of compressive stress; and
   forming on said second dielectric layer a second metal layer.

8. The process of claim 7 wherein said first forming step comprises forming a first dielectric layer having an outer surface of silicon nitride, and said third forming step comprises forming said second dielectric layer by plasma assisted deposition of silicon oxide.

9. The process of claim 8 wherein said second forming step comprises forming said first metal from an aluminum alloy.

10. A process for fabricating electronic devices on a substrate comprising:
    forming on said substrate a first dielectric layer;
    forming on said first dielectric layer a first metal layer;
    forming on said first metal layer a substantially pure oxide layer by plasma assisted chemical vapor deposition;
    forming on said substantially pure oxide layer a doped oxide layer by chemical vapor deposition; and
    forming on said doped oxide layer a second metal layer.

11. The process of claim 8 or 10 further comprising forming on said second metal layer a passivation layer comprising a first portion formed by plasma assisted deposition of silicon oxide and a second portion formed by chemical vapor deposition of silicon oxide.

12. An electronic device fabricated according to the process of claim 1, 2, 3, 4, 5, 6, 7, 8, 9, or 10.

* * * * *

(12) EX PARTE REEXAMINATION CERTIFICATE (5687th)
United States Patent
Candelaria et al.

(10) Number: US 4,446,194 C1
(45) Certificate Issued: Mar. 6, 2007

(54) DUAL LAYER PASSIVATION

(75) Inventors: Joe Candelaria, Mesa, AZ (US); Kurt S. Heidinger, Santa Clara, CA (US)

(73) Assignee: Motorola Inc., Schaumburg, IL (US)

Reexamination Request:
No. 90/007,062, Jun. 3, 2004

Reexamination Certificate for:
Patent No.: 4,446,194
Issued: May 1, 1984
Appl. No.: 06/391,047
Filed: Jun. 21, 1982

(51) Int. Cl.
*B05D 3/14* (2006.01)

(52) U.S. Cl. .................. 428/428; 428/432; 257/635; 257/E23.167; 427/255.37; 427/573; 427/579; 438/624; 438/763

(58) Field of Classification Search .................. None
See application file for complete search history.

(56) References Cited

U.S. PATENT DOCUMENTS

| | | |
|---|---|---|
| 3,385,729 A | 5/1968 | Larchian |
| 3,424,661 A | 1/1969 | Androshuk et al. |
| 3,457,125 A | 7/1969 | Kerr |
| 3,475,210 A | 10/1969 | Lehrer |
| 3,507,766 A | 4/1970 | Cunningham et al. |
| 3,597,269 A | 8/1971 | Chang et al. |
| 3,597,667 A | 8/1971 | Horn |
| 3,635,774 A | 1/1972 | Ohta |
| 3,736,406 A | 5/1973 | Vossen et al. |
| 3,745,428 A | 7/1973 | Misawa et al. |
| 3,760,242 A | 9/1973 | Duffy et al. |
| 3,788,913 A | 1/1974 | Ono et al. |
| 3,838,442 A | 9/1974 | Humphreys |
| 3,874,915 A | 4/1975 | Ono et al. |
| 3,916,034 A | 10/1975 | Tsuchimoto |
| 3,924,024 A | 12/1975 | Naber et al. |
| 3,967,310 A | 6/1976 | Horiuchi et al. |
| 3,979,768 A | 9/1976 | Takei et al. |
| 3,988,823 A | 11/1976 | Hu |
| 4,001,871 A | 1/1977 | Tsunemitsu |

(Continued)

FOREIGN PATENT DOCUMENTS

| | | |
|---|---|---|
| JP | S 47-13273 | 7/1972 |
| JP | S 48-36599 | 11/1973 |
| JP | S 49-4486 | 1/1974 |
| JP | S 49-4994 | 2/1974 |
| JP | S 49-33232 | 9/1974 |
| JP | S 51-33575 | 3/1976 |
| JP | S 51-21753 | 7/1976 |
| JP | S 51-117887 | 10/1976 |
| JP | S 52-28870 | 3/1977 |
| JP | S 52-51868 | 4/1977 |

(Continued)

OTHER PUBLICATIONS

Vossen et al., J. Vac. Sci. Technol., vol. 11, No. 1, Jan./Feb. 1974, pp. 60–70.* van de Ven, Solid State Tech., 1981, p. 167.*

"Improvement of the Gate Region Integrity in FET Devices," IBM Technical Disclosure Bulletin, Apr. 1972, pp. 3348–3350.

D.R. Kerr, et al., "Stabilization of Si $O_2$ Passivation Layers with $P_2O_5$," IBM Journal, Sep. 1964 (Presented in part at IEEE Solid State Device Research Conference, Boulder, Colo., Jul. 2, 1964), pp. 377–384.

(Continued)

*Primary Examiner*—Stephen Stein

(57) ABSTRACT

When multilayer-metal electronic devices are heated, voids can form in the metal layers. Void formation is avoided by using a double dielectric layer as the interlayer dielectric. The double layer has a first oxide layer portion in contact with the first metal which is formed by plasma assisted chemical vapor deposition, and a second oxide layer portion formed by other means. The plasma formed oxide layer portion is believed to be in compressive stress relative to the substrate.

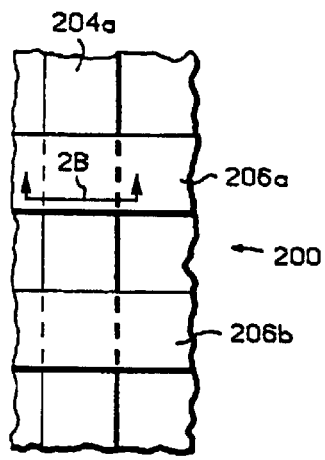

U.S. PATENT DOCUMENTS

| | | | |
|---|---|---|---|
| 4,022,931 A | 5/1977 | Black et al. | |
| 4,045,594 A | 8/1977 | Maddocks | |
| 4,060,660 A | 11/1977 | Carlson et al. | |
| 4,065,781 A | 12/1977 | Gutknecht | |
| 4,066,037 A | 1/1978 | Jacob | |
| 4,075,367 A | 2/1978 | Gulett | |
| 4,089,766 A | 5/1978 | Paal et al. | |
| 4,091,169 A | 5/1978 | Bohg et al. | |
| 4,097,889 A | 6/1978 | Kern et al. | |
| 4,111,775 A | 9/1978 | Hollis, Jr. et al. | |
| 4,113,515 A | 9/1978 | Kooi et al. | |
| 4,123,565 A | 10/1978 | Sumitomo et al. | |
| 4,132,829 A | 1/1979 | Hudis | |
| 4,142,004 A | 2/1979 | Hauser et al. | |
| 4,144,634 A | 3/1979 | Chang et al. | |
| 4,158,717 A | 6/1979 | Nelson | |
| 4,161,743 A | 7/1979 | Yonezawa et al. | |
| 4,173,661 A | 11/1979 | Bourdon | |
| 4,181,755 A | 1/1980 | Liu et al. | |
| 4,196,232 A | 4/1980 | Schnable et al. | |
| 4,198,444 A | 4/1980 | Yerman | |
| 4,199,384 A | 4/1980 | Hsu | |
| 4,212,684 A | 7/1980 | Brower | |
| 4,223,048 A | 9/1980 | Engle, Jr. | |
| 4,226,667 A | 10/1980 | Logan | |
| 4,234,362 A | 11/1980 | Riseman | |
| 4,250,428 A | 2/1981 | Oliver et al. | |
| 4,262,631 A | 4/1981 | Kubacki | |
| 4,282,268 A | 8/1981 | Priestley et al. | |
| 4,289,797 A | 9/1981 | Akselrad | |
| 4,291,328 A | 9/1981 | Lien et al. | |
| 4,305,974 A | 12/1981 | Abe et al. | |
| 4,307,179 A | 12/1981 | Chang et al. | |
| 4,318,936 A | 3/1982 | Moss et al. | |
| 4,323,589 A | 4/1982 | Ray et al. | |
| 4,329,418 A | 5/1982 | Kny et al. | |
| 4,330,569 A | 5/1982 | Gulett et al. | |
| 4,331,462 A | 5/1982 | Fleming, Jr. et al. | |
| 4,331,737 A | 5/1982 | Nishizawa et al. | |
| 4,349,373 A | 9/1982 | Sterling et al. | |
| 4,349,609 A | 9/1982 | Takeda et al. | |
| 4,365,264 A | 12/1982 | Mukai et al. | |
| 4,367,119 A | 1/1983 | Logan et al. | |
| 4,371,587 A | 2/1983 | Peters | |
| 4,374,179 A | 2/1983 | Lin et al. | |
| 4,381,595 A | 5/1983 | Denda et al. | |
| 4,389,970 A | 6/1983 | Edgerton | |
| 4,394,400 A | 7/1983 | Green et al. | |
| 4,394,401 A | 7/1983 | Shioya et al. | |
| 4,401,687 A | 8/1983 | Rosler et al. | |
| 4,407,859 A * | 10/1983 | Jones | 216/18 |
| 4,410,558 A | 10/1983 | Izu et al. | |
| 4,417,325 A | 11/1983 | Harari | |
| 4,419,385 A | 12/1983 | Peters | |
| 4,439,463 A | 3/1984 | Miller | |
| 4,442,591 A | 4/1984 | Haken | |
| 4,443,529 A | 4/1984 | Kanbe et al. | |
| 4,564,997 A * | 1/1986 | Matsuo et al. | 438/631 |
| 4,621,277 A | 11/1986 | Ito et al. | |
| RE32,351 E | 2/1987 | Dawson et al. | |
| 4,668,973 A | 5/1987 | Dawson et al. | |
| 4,676,867 A | 6/1987 | Elkins et al. | |
| 4,986,878 A | 1/1991 | Malazgert et al. | |
| 5,994,231 A | 11/1999 | Sonego et al. | |
| 6,077,786 A | 6/2000 | Chakravarti et al. | |
| 2004/0166695 A1 | 8/2004 | Yuan et al. | |

FOREIGN PATENT DOCUMENTS

| | | |
|---|---|---|
| JP | S 52-89468 | 7/1977 |
| JP | S 53-3172 | 1/1978 |
| JP | S 53-57972 | 5/1978 |
| JP | S 53-74392 | 7/1978 |
| JP | S 53-148281 | 12/1978 |
| JP | S 54-59889 | 5/1979 |
| JP | S 54-87175 | 7/1979 |
| JP | S 55-6291 | 2/1980 |
| JP | S 55-71040 | 5/1980 |
| JP | S 55-134938 | 10/1980 |
| JP | S 56-21345 | 2/1981 |
| JP | S 56-32732 | 4/1981 |
| JP | S 56-33899 | 4/1981 |
| JP | S 56-165339 | 12/1981 |
| JP | S 57-36834 | 2/1982 |
| JP | S 57-45931 | 3/1982 |
| JP | S 57-47711 | 3/1982 |
| JP | S 57-104225 | 6/1982 |
| JP | S 57-149752 | 9/1982 |
| JP | S 57-170550 | 10/1982 |
| JP | S 58-73124 | 5/1983 |
| JP | S 58-169928 | 10/1983 |

OTHER PUBLICATIONS

Plummer, et al., Silicon VLSI Technology: Fundamentals, Practice, and Modeling, Prentice Hall, 2000, pp. 734–735.

K. O'Dennell, "Stress Control in NIV, Cr and TiW Thin Films Used in UBM and Backside Metallization," NEXX Systems LLC, Undated, pp. 1–6.

Madou, Fundamentals of Microfabrications, CRC Press, 1997, pp. 219–224 (Additionally cited as all, esp. 219–224).

Chang, R.P.H., "Multipurpose Plasma Reactor for Materials Research and Processing," J. Vac. Col. Sci. Technol., vol. 14, No. 1, Jan./Feb. 1977, pp. 278–280.

Vossen, et al., "Thin Film Processes," Academic Press, Inc., 1978, pp,. 115–117, and pp. 351–353 (additionally cited as all, esp. 23).

Hollahan, et al., "Techniques and Applications of Plasma Chemistry," John Wiley & Sons, 1974 (Chap. I: pp. 1–3; Chap. 9: p. 347 and pp. 366–367).

Flip Chips Tutorial 22, FlipChips.com.

Vossen, J.L., "Control of Film Properties by rf–Sputtering Techniques," Journal of Vac. Sci. Technol., vol. 8, No. 5, 1971, pp. 912–930.

Coburn, et al., "A Study of the Neutral Species RF Sputtered from Oxide Targets," Proc. $6^{th}$ Interml. Vacuum Cong., Japan J. Appl. Phys. Suppl. 2, Pt. 1, 1974, pp. 501–504.

Coburn, et al., "Techniques for Elemental Compostion Profiling in Thin Films," CRC Critical Reviews in Solid State Sciences, Sep. 1974, pp. 561–584.

Rosier, et al., "A Production Reactor for Low Temperature Plasma–Enhanced Silicon Nitride Deposition," Solid State Technology, 1976, pp. 45–50.

De Simone, et al., "FET RAMs," IEEE International Solid State Circuits Conference, Feb. 15, 1979, pp. 151–156.

Wilson, Arthur M., "Polyimide Insulators for Multilevel Interconnections," Elsevier Sequoia/Printed in The Netherlands, Mar. 1981, pp. 145–163.

Mastroianni, Sal T., "Multilevel Metallization Device Structures and Process Options," Solid State Technology, 1984, pp. 155–161.

Bartush, et al., "Composite Insulators," IBM Technical Disclosure Bulletin, vol. 23, No. 11, Apr. 1981.

Mattson, Brad, "CVD Films for Interlayer Dielectrics", Solid State Technology, Jan. 1980, pp. 60–64.

Barson, et al., "Hillock Suppression in Aluminum Thin Films," IBM Technical Disclosure Bulletin, vol. 13, No. 5, Oct. 1970.

Bartush, T.A., "Dual Dielectric For Multilevel Metal," IBM Technical Disclosures Bulletin, vol. 23, No. 9, Feb. 1981, p. 4140.

Logan, et al., "Oxide–Nitride Dual Insulator Process For Memory Metallization; Large–Small Via Etch Sequence," IBM Technical Disclosure Bulletin, vol. 23, No. 7B, Dec. 1980, pp. 3210–3211.

Abrahamsvich, et al., "Method For Polimide Passivation of Multileral Metal Integrated Circuit Chip," IBM Technical Disclosure Bulletin, vol. 23, No. 5, Oct. 1980, p. 1832.

Pliskein, W.A., "Comparison of Properties of Dielectric Films Deposited by Various Methods," J. Vac. Sci. Technol., vol. 14, No. 5 Sep./Oct. 1977, pp. 1064–1081.

Ghate, P.B., "Failure Mechanism Studies on Multilevel Metallization Systems for LSI," Final Technical Report No. RADC–TR–71–168 (US Air Force Contract No. F30602–70–C–0214, 1971).

"Double Dielectric Process for Multilevel Metal," IBM Technical Disclosure Bulletin, Sep. 1979, pp. 1442–1445.

Benjamin, et al., "Stress Generated on Aluminum During Anodization as a Function of Current Density and pH," Oxidation of Metals, vol. 52, Nos. ¾, 1999, pp. 209–219.

Teschke, et al., "In Situ Determination of the Mechanical Stress in Anodic Aluminum Films," J. Electroanal.Chem., 338 (1992) pp. 145–153.

Vossen, J.L., et al, "Processes for Multilevel Metallization," Journal of Vacuum Science and Technology, vol. 11, No. 1, Jan./Feb. 1974, pp. 60–70.

Van De Ven, E.P.G.T., "Plasma Deposition of Silicon Dioxide and Silicon Nitride Films," Solid State Technology: The Device and Circuit Manufacturers' Journal, Semicon/West Show Issue, Apr. 1981, pp. 167–171.

S. Wolf, et al., "Silicon Processing for The VLSI Era," vol. 1 Processing Technology, Lattice Press, 1986, pp. 114–117.

Ghandi, "VLSI Fabrication Principles: Silicon and Gallium Arsenide," John Wiley & Sons, Inc., 1994, pp. 524–525, 528–530.

Sze, "VSLI Technology," McGraw–Hill Book Co., 1983, pp. 95, 106, 107, 119, 267 and 273–274 (additionally cited as all, esp. 95, 106–107, 119).

Kern, et al., "Chemical Vapor Deposition of Silicate Glasses for Use with Silicon Devices," J. Electrochem, Soc.: Electrochemical Technology, Apr. 1970, pp. 562–568.

Kern, et al., "Deposition and Properties of Silicon Dioxide and Silicate Films Prepared by Low–Temperature Oxidation of Hydrides," RCA Review, Dec. 1970, pp. 715–727.

Chu, et al., "Recent Advances in the Chemical Vapor Growth of Electronic Materials," J. Vac. Col. Sci. Technol., vol. 10, No. 1, pp. 1–10.

Ghandi, S.K., "VLSI Fabrication Principles," John Wiley & Sons, 1983, pp. 422–423, 427–429 (additionally cited as all esp. 422–423, 427–429).

Plummer, et al., "Silicon VLSI Technology," Prentice Hall, Inc., 2000, pp. 539, 547–549.

Chrisey, et al., "Pulsed Laser Deposition of Then Films," John Wiley & Sons, Inc., 1994, pp. IX–XXII.

* cited by examiner

EX PARTE REEXAMINATION CERTIFICATE ISSUED UNDER 35 U.S.C. 307

THE PATENT IS HEREBY AMENDED AS INDICATED BELOW.

AS A RESULT OF REEXAMINATION, IT HAS BEEN DETERMINED THAT:

Claims 1–12 are cancelled.

\* \* \* \* \*